United States Patent
Subramanian et al.

(10) Patent No.: US 9,985,664 B2
(45) Date of Patent: May 29, 2018

(54) RANDOM DELAY GENERATION FOR THIN-FILM TRANSISTOR BASED CIRCUITS

(71) Applicant: Thin Film Electronics ASA, Oslo (NO)

(72) Inventors: Vivek Subramanian, Orinda, CA (US); Mingming Mao, Cupertino, CA (US); Zhigang Wang, Sunnyvale, CA (US)

(73) Assignee: Thin Film Electronics, ASA, Oslo (NO)

( * ) Notice: Subject to any disclaimer, the term of this patent is extended or adjusted under 35 U.S.C. 154(b) by 334 days.

(21) Appl. No.: 14/328,187

(22) Filed: Jul. 10, 2014

(65) Prior Publication Data

US 2014/0323035 A1    Oct. 30, 2014

Related U.S. Application Data

(62) Division of application No. 12/625,435, filed on Nov. 24, 2009, now Pat. No. 8,810,298.
(Continued)

(51) Int. Cl.
*H01L 21/66* (2006.01)
*H03B 5/12* (2006.01)
(Continued)

(52) U.S. Cl.
CPC ............. *H04B 1/04* (2013.01); *G06K 7/0008* (2013.01); *G06K 7/10059* (2013.01);
(Continued)

(58) Field of Classification Search
CPC .................... H03K 3/033; H03K 3/355; H01L 2924/0002; G06K 7/0008; G06K 7/10356;
(Continued)

(56) References Cited

U.S. PATENT DOCUMENTS 3,562,559 A    2/1971    Rapp
4,795,898 A    1/1989    Bernstein et al.
(Continued)

FOREIGN PATENT DOCUMENTS

DE    3219682 A1    11/1983
EP    0006691 A1    1/1980
(Continued)

OTHER PUBLICATIONS

Electronics-tutorials, Clock oscillator, May 2008 https://web.archive.org/web/20080415194901/http://www.electronics-tutorials.ws/sequential/seq_3.html.*
(Continued)

*Primary Examiner* — James Yang
(74) *Attorney, Agent, or Firm* — Andrew D. Fortney; Central California IP Group, P.C.

(57) ABSTRACT

Circuits and circuit elements configured to generate a random delay, a monostable oscillator, circuits configured to broadcasting repetitive messages wireless systems, and methods for forming such circuits, devices, and systems. The present invention advantageously provides relatively low cost delay generating circuitry based on TFT technology in wireless electronics applications, particularly in RFID applications. Such novel, technically simplified, low cost TFT-based delay generating circuitry enables novel wireless circuits, devices and systems, and methods for producing such circuits, devices and systems.

20 Claims, 7 Drawing Sheets

Related U.S. Application Data (60) Provisional application No. 61/118,184, filed on Nov. 26, 2008.

(51) Int. Cl.

| | | |
|---|---|---|
| *H04B 1/04* | (2006.01) | |
| *G06K 7/00* | (2006.01) | |
| *G06K 7/10* | (2006.01) | |
| *H03K 3/03* | (2006.01) | |
| *H03K 5/13* | (2014.01) | |
| *H03K 5/133* | (2014.01) | |
| *H04H 20/16* | (2008.01) | |
| *H03K 3/033* | (2006.01) | |
| *H03K 3/355* | (2006.01) | |
| *G06K 19/07* | (2006.01) | |

(52) U.S. Cl.
CPC ........... *H01L 22/20* (2013.01); *H03B 5/1203* (2013.01); *H03K 3/033* (2013.01); *H03K 3/0315* (2013.01); *H03K 3/355* (2013.01); *H03K 5/13* (2013.01); *H03K 5/133* (2013.01); *H04H 20/16* (2013.01); *G06K 19/0723* (2013.01); *H01L 2924/0002* (2013.01)

(58) Field of Classification Search
CPC .... G06K 19/0723; G06K 19/06; H04L 67/24; H04N 21/64322
See application file for complete search history.

(56) References Cited

U.S. PATENT DOCUMENTS

| | | | |
|---|---|---|---|
| 5,053,774 A | 10/1991 | Schuermann et al. | |
| 5,438,335 A | 8/1995 | Schuermann et al. | |
| 5,444,448 A | 8/1995 | Schuermann et al. | |
| 6,078,824 A | 6/2000 | Sogo | |
| 7,026,882 B2 | 4/2006 | Ganivet et al. | |
| 7,387,260 B1 | 6/2008 | MacKenzie et al. | |
| 2004/0257204 A1 | 12/2004 | Liao et al. | |
| 2005/0093679 A1* | 5/2005 | Zai | G06K 7/10356 340/10.2 |
| 2006/0017659 A1 | 1/2006 | Ogawa et al. | |
| 2006/0155512 A1 | 7/2006 | Ariav et al. | |
| 2006/0211187 A1 | 9/2006 | Choi et al. | |
| 2006/0214772 A1 | 9/2006 | Hsieh et al. | |
| 2007/0070661 A1 | 3/2007 | Baude et al. | |
| 2007/0126556 A1 | 6/2007 | Subramanian et al. | |
| 2007/0182578 A1* | 8/2007 | Smith | G06K 19/06 340/669 |
| 2007/0184670 A1 | 8/2007 | Koyama | |
| 2007/0273426 A1 | 11/2007 | Cantatore | |
| 2008/0014893 A1 | 1/2008 | Kawae et al. | |

FOREIGN PATENT DOCUMENTS

| | | | |
|---|---|---|---|
| EP | 0301127 | A1 | 2/1989 |
| JP | 5227248 | A | 3/1977 |
| JP | 5539457 | A | 3/1980 |
| JP | 59223014 | A1 | 12/1984 |
| WO | 8706747 | A1 | 11/1987 |
| WO | 2005081307 | A1 | 9/2005 |
| WO | 2005104372 | A1 | 11/2005 |

OTHER PUBLICATIONS

Guiot et al, Active pullup-pulldown, 2005.*
CMU, Passive Loads vs Active Loads, 1999 https://www.ece.cmu.edu/~ee321/spring99/LECT/lect26apr28.pdf.*
International Search Report and Written Opinion of the International Searching Authority; International Application No. PCT/US2009/065817, dated Apr. 20, 2010; 9 pages; International Searching Authority/United States, Commissioner for Patents, Alexandria, Virginia.
International Preliminary Report on Patentability; International Application No. PCT/US2009065817; dated May 31, 2011; 7 pages; The International Bureau of WIPO; Geneva, Switzerland.
Extended European Search Report dated Nov. 9, 2015; European Patent Application No. 09829772.4; 23 pgs.; European Patent Office, Munich, Germany.
Hirobumi Sasaki and Noriyasu Koshiba; "Monostable Multivibrator Using CMOS-NOR Circuit"; Bibliographic data of JPS59223014 (A); Dec. 14, 1984; 2 pgs.; http://worldwide.espacenet.com.
Hiroshi Kato; "Pulse Generation Circuit"; Patent Abstracts of Japan; Publication No. 55039457; Mar. 19, 1980; http://worldwide.espacenet.com.
Hirotoshi Takeuchi; "Monostable Multivibrator"; Bibliographic data of JPS5227248 (A); Mar. 1, 1977; http://worldwide.espacenet.com.
William R.S. Hepler; "Modified One-shot Provides Long Delay Time"; Electronic Design; p. 94; Apr. 26, 1970.
Gerd Harms; "Grundlagen und Praxis digitaler Schaltkreise"; Electrotechnik, vol. 51, p. 25; 2 pgs.; 1972.
Werner Reckziegel; "Zeitschaltungen mit CMOS-Schaltkreisen"; Radio Femsehen Elektronik, vol. 30; 4 pgs.; 1981.

* cited by examiner

RANDOM DELAY GENERATION FOR THIN-FILM TRANSISTOR BASED CIRCUITS

RELATED APPLICATIONS

This application is a divisional of U.S. patent application Ser. No. 12/625,435, filed Nov. 24, 2009, pending, which claims the benefit of U.S. Provisional Patent Application No. 61/118,184, filed Nov. 26, 2008, both of which are incorporated herein by reference in their entireties.

FIELD OF THE INVENTION

The present invention generally relates to the field of wireless communications circuits. More specifically, embodiments of the present invention pertain to circuits and circuit elements for generating random delay in wireless systems, circuits for broadcasting messages in low frequency (LF), high frequency (HF), very high frequency (VHF) and ultra-high frequency (UHF) and radio frequency identification (RFID) systems, tags and other devices containing such circuits, systems including such tags and devices, and methods for forming collision-tolerant wireless systems.

DISCUSSION OF THE BACKGROUND

Figure 1:
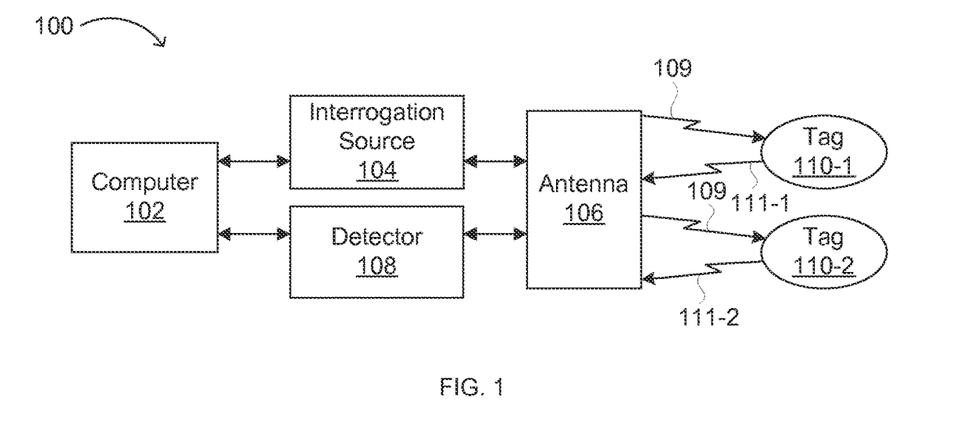
FIG. 1 is a block representation of an exemplary conventional radio frequency identification (RFID) system.

Many communication circuits require random delay generators to arbitrate collisions between competing information streams. For example, FIG. 1 is a schematic representation of an exemplary radio frequency identification (RFID) system. Computer 102 instructs interrogation source 104 to generate an interrogatory signal, which is broadcast via antenna 106 as interrogatory RF broadcast 109. RFID tags 110-1 and 110-2 each receive the interrogatory RF broadcast 109, and are energized thereby. Both tags may then attempt to broadcast a repetitive ID message (e.g., ID message 111-1 from tag 110-1 and ID message 111-2 from tag 110-2) simultaneously. Antenna 106 may receive messages 111-1 and 111-2 simultaneously, resulting in a collision between the ID broadcasts at detector 108. Thus, introducing a random delay in the ID broadcast of tag 110-1, tag 110-2, or both may effectively avoid such broadcast collisions.

Figure 2:
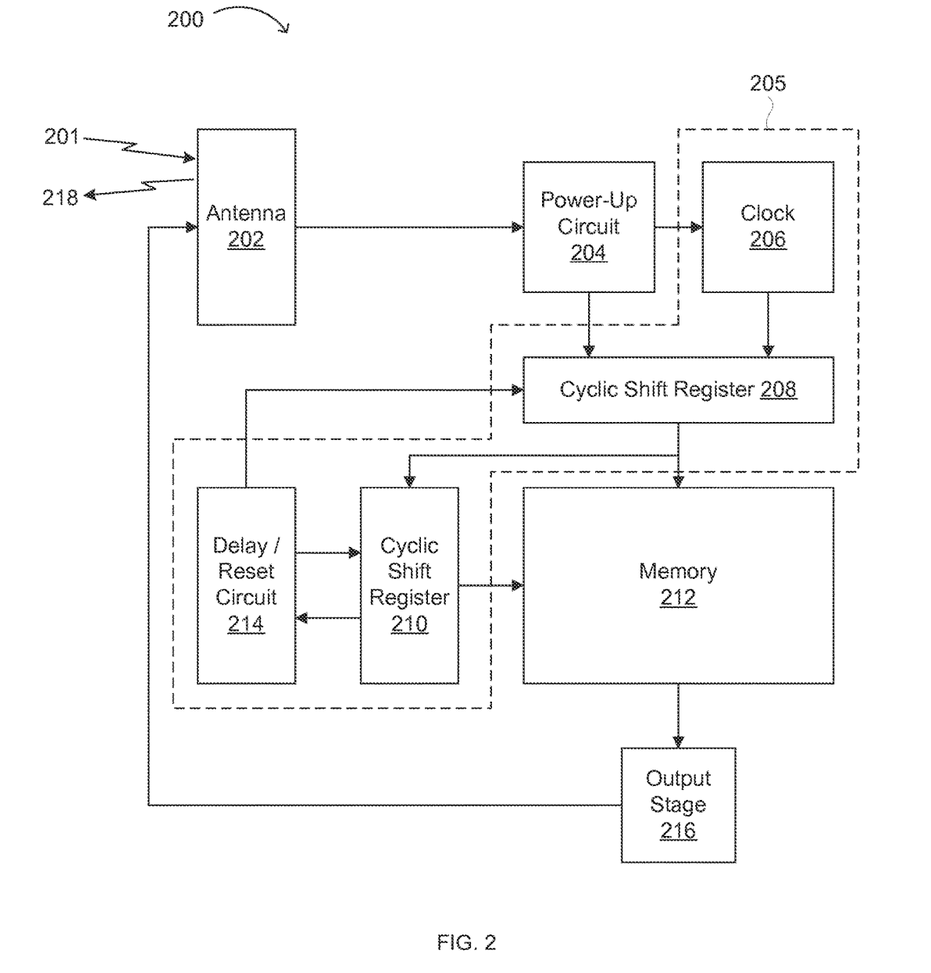
FIG. 2 is a block diagram of a conventional RFID tag.

FIG. 2 shows a schematic representation of an exemplary conventional RFID tag configured to generate a repetitive ID message upon receiving an interrogatory RF signal. An interrogatory RF signal 201 is received by antenna 202, and the RFID tag is powered by power-up circuit 204. An identification message stored in memory 212 is generated and transmitted to output stage 216, with a delay introduced in the transmission of the identification message from memory 212 to output stage 216 by a delay generating circuit 205 comprising clock 206, cyclic shift registers 208 and 210, and delay/reset circuitry 214. The delayed identification message is then transmitted by output stage 216 for broadcast by antenna 202. The amount of delay introduced by delay/reset circuit 214 between cyclic shift registers 208 and 210 may be selected so as to reduce the probability of collision between two or more RFID tags in an RFID system.

In some electronics applications, circuits and/or circuit elements may be implemented using thin-film transistor (TFT) technology. Such TFT-based circuits and/or circuit elements may be advantageous because of their low cost and broad applicability relative to conventional CMOS manufacturing processes. For example, TFT circuitry may be implemented on a variety of substrates (e.g., on flexible substrates, such as those comprising or consisting essentially of organic polymers or metallic foils) and may be fabricated using relatively economical methods (e.g., printing). However, the complexity of circuitry which may be based on TFT technology is typically limited due to economic and technical reasons. As a result, the number of transistors which may be available for implementing relatively complex circuit functions (e.g., conventional random delay generation circuits) is somewhat limited. Since random delay generation circuits (e.g., delay generating circuit 205 as shown in FIG. 2) are often critically important in minimizing collisions in communication systems, it would be technically and economically advantageous to implement a simple, TFT-based random delay generation circuit.

SUMMARY OF THE INVENTION

In a first aspect, the present invention relates to a circuit configured to generate a delay, including a delay element having an input terminal and an output terminal, a capacitor having a first terminal receiving an input and a second terminal coupled to the input of the delay element, and a thin-film field-effect transistor (TFT) having a first and second source/drain terminals and a gate, configured to provide a current and/or voltage to said capacitor, where the current and/or voltage has a value that falls randomly within a predetermined range.

In a second aspect, the present invention relates to a monostable oscillator, including a capacitor, a resistive element providing a current and/or voltage to a first electrode of a capacitor, and a feedback path, where the current and/or voltage has a value that falls randomly within a predetermined range.

In a third aspect, the present invention relates to circuit configured to broadcast a repetitive (identification) message in a wireless circuit, including an antenna configured to receive a power transmission and broadcast a repetitive (identification) message, a power-up circuit providing an initiation signal, a monostable oscillator configured to provide a repeating timing signal, a memory element providing the (identification) message, and an output circuit configured to broadcast the (identification) message in response to the timing signal.

In a fourth aspect, the present invention relates to an RFID system including at least two RFID tags, each tag having an antenna configured to receive a power transmission and broadcast a repetitive (identification) message, a power converting element coupled to the antenna, and a circuit configured to generate the repetitive (identification) message, where the circuit includes at least one thin film transistor (TFT) configured to introduce a random delay in broadcasting the repetitive (identification) message.

In a fifth aspect, the present invention relates to a method of forming a collision tolerant wireless system, including determining a target variation range in the broadcast delay of a plurality of wireless devices having substantially the same architecture, the target variation range being configured to reduce a broadcast collision frequency between the wireless devices when the wireless devices broadcast repetitive messages in the same read field; determining a random variation range in the broadcast delay of the wireless devices, comparing the target variation range and the random variation range; and if the random variation range is at least equal to the target variation range, making the wireless devices having the random variation range in their broadcast delay.

The present invention advantageously provides relatively low cost wireless devices with delay generating circuitry based on TFT technology in electronics applications, particularly in RFID applications. Such novel, technically simplified, low cost TFT-based delay generating circuitry enables novel wireless circuits, devices, systems, and methods for producing such devices and systems. These and other advantages of the present invention will become readily apparent from the detailed description below.

DETAILED DESCRIPTION

Reference will now be made in detail to the various embodiments of the invention, examples of which are illustrated in the accompanying drawings. While the invention will be described in conjunction with the following embodiments, it will be understood that the description is not intended to limit the invention to these embodiments. On the contrary, the invention is intended to cover alternatives, modifications and equivalents that may be included within the spirit and scope of the invention as defined by the appended claims. Furthermore, in the following detailed description, numerous specific details are set forth in order to provide a thorough understanding of the present invention. However, it will be readily apparent to one skilled in the art that the present invention may be practiced without these specific details. In other instances, well-known methods, procedures, components, and circuits have not been described in detail, so as not to unnecessarily obscure aspects of the present invention.

Some portions of the detailed descriptions that follow are presented in terms of processes, procedures, logic blocks, functional blocks, processing, and other symbolic representations of operations on code, data bits, data streams or waveforms within a computer, processor, controller and/or memory. These descriptions and representations are generally used by those skilled in the data processing arts to effectively convey the substance of their work to others skilled in the art. A process, procedure, logic block, function, process, etc., is herein, and is generally, considered to be a self-consistent sequence of steps or instructions (or circuitry configured to perform or execute the same) leading to a desired and/or expected result. The steps generally include physical manipulations of physical quantities. Usually, though not necessarily, these quantities take the form of electrical, magnetic, optical, or quantum signals capable of being stored, transferred, combined, compared, and otherwise manipulated in a computer or data processing system. It has proven convenient at times, principally for reasons of common usage, to refer to these signals as bits, waves, waveforms, streams, values, elements, symbols, characters, terms, numbers, or the like, and to their representations in computer programs or software as code (which may be object code, source code or binary code).

It should be borne in mind, however, that all of these and similar terms are associated with the appropriate physical quantities and/or signals, and are merely convenient labels applied to these quantities and/or signals. Unless specifically stated otherwise and/or as is apparent from the following discussions, throughout the present application, discussions utilizing terms such as "processing," "operating," "computing," "calculating," "determining," "transforming" or the like, refer to the action and processes of a computer or data processing system, or similar processing device (e.g., an electrical, optical, or quantum computing or processing device or circuit), that manipulates and/or transforms data represented as physical (e.g., electronic) quantities. The terms refer to actions and processes of the processing devices that manipulate or transform physical quantities within the component(s) of a circuit, system or architecture (e.g., registers, memories, other such information storage, transmission or display devices, etc.) into other data similarly represented as physical quantities within other components of the same or a different system or architecture.

Furthermore, in the context of this application, the terms "wire," "wiring," "line," "signal," "conductor" and "bus" refer to any known structure, construction, arrangement, technique, method and/or process for physically transferring a signal from one point in a circuit to another. Also, unless indicated otherwise from the context of its use herein, the terms "known," "fixed," "given," "certain" and "predetermined" generally refer to a value, quantity, parameter, constraint, condition, state, process, procedure, method, practice, or combination thereof that is, in theory, variable, but is typically set in advance and not varied thereafter when in use.

Similarly, for convenience and simplicity, the terms "clock," "time," "timing," "rate," "period" and "frequency" are, in general, interchangeable and may be used interchangeably herein, but are generally given their art-recognized meanings. Also, for convenience and simplicity, the terms "data," "data stream," "bits," "bit string," "waveform" and "information" may be used interchangeably, as may the terms "connected to," "coupled with," "coupled to," and "in communication with" (which may refer to direct or indirect connections, couplings, or communications), but these terms are generally given their art-recognized meanings herein. Further, a "tag" may refer to a single device or to a sheet and/or a spool comprising a plurality of attached structures, suitable for electronic article surveillance (EAS), high frequency (HF), very high frequency (VHF), ultrahigh frequency (UHF), radio frequency (RF) and/or RF identification (RFID) purposes and/or applications.

Traditional CMOS semiconductor fabrication methods typically employ single crystal silicon substrates. Accordingly, in the case of a solid state transistor, a channel region of each transistor formed in a single crystal silicon substrate will have predictable properties and electrical characteristics with low variance from device to device, such as threshold voltage, on current, or leakage current. While slight variations in these values may occur from device to device (e.g., as a result of doping of the substrate, processing and/or other manufacturing variations, etc.), such variations are typically quite small due to rigorous control of process variables. However, single crystal silicon wafers are relatively expensive, and rigorous control of process variables generally requires relatively elaborate, energy intensive process equipment and control mechanisms (e.g., ultrahigh vacuum chambers, process equipment for handling toxic, corrosive, and/or pyrophoric gaseous feedstocks, cleanrooms and rigorous cleanroom protocols, etc.), which result in higher costs typically associated with traditional CMOS semiconductor fabrication methods.

Figure 3:
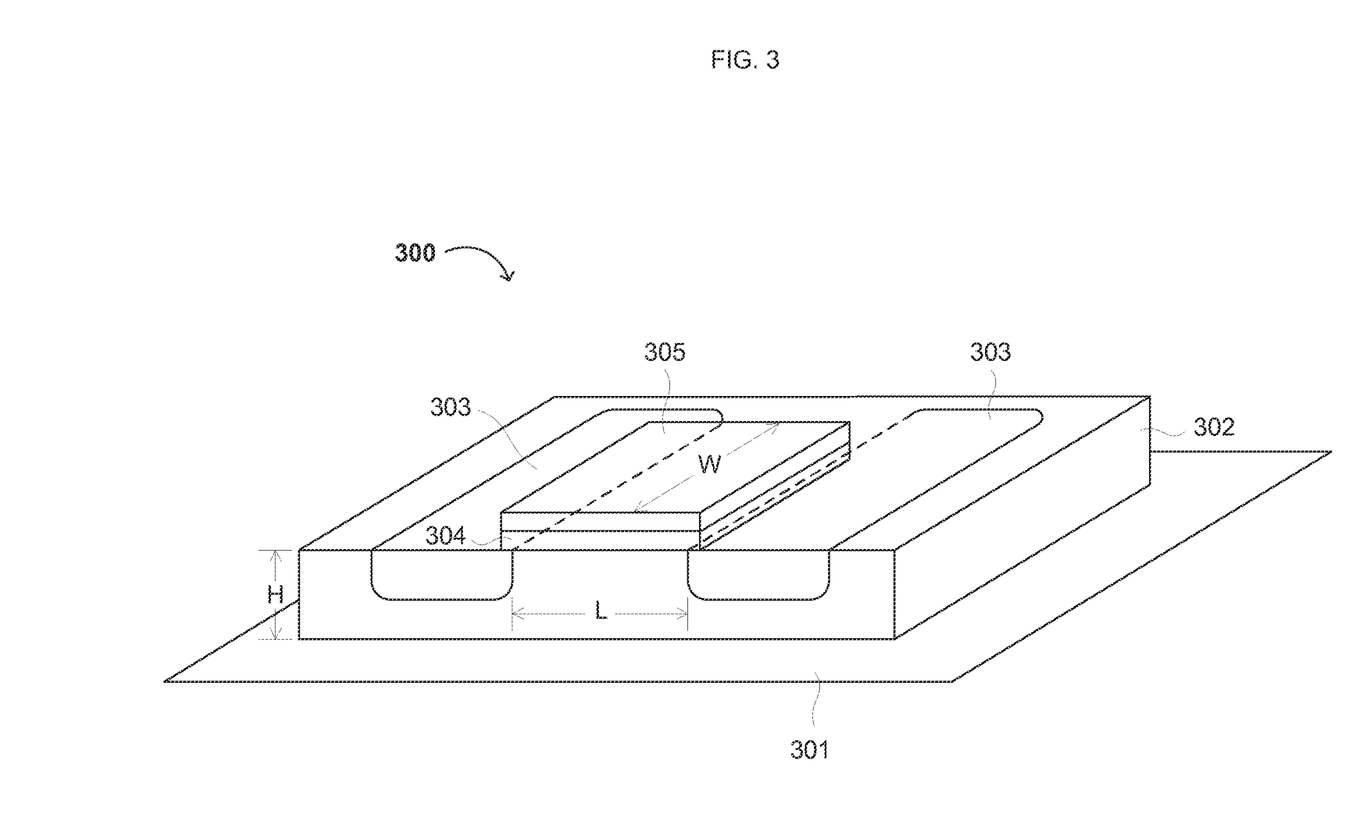
FIG. 3 is a cross-sectional diagram of an exemplary TFT.

There is generally a much greater device-to-device variability associated with the fabrication of thin-film transistors. TFTs are generally not manufactured on single crystal silicon under the rigorously controlled conditions associated with traditional semiconductor fabrication methods. Consequently, there is generally increased variability associated with TFT fabrication processes relative to conventional semiconductor fabrication processes. FIG. 3 shows a generic representation of a TFT 300. TFT 300 comprises a semiconductor substrate or body 302 deposited on a substrate 301. Undoped and/or doped semiconductor precursor inks comprising undoped and/or doped polysilanes, heterocyclosilanes and/or undoped and/or doped semiconductor nanoparticles may be deposited or printed by a suitable printing method (e.g., inkjet, offset lithography, screen printing, etc.) in a desired pattern on substrate 301, then cured and/or annealed to form semiconductor body 302. Semiconductor precursor inks comprising polysilanes may be described in U.S. Pat. Nos. 7,422,708, 7,553,545, 7,498,015, and 7,485,691, and U.S. patent application Ser. No. 11/867,587, filed Oct. 4, 2007, the relevant portions of each of which are incorporated herein by reference. Semiconductor precursor inks comprising heterocyclosilanes may be described in U.S. Pat. No. 7,314,513, U.S. patent application Ser. No. 10/950,373, filed Sep. 24, 2004 and U.S. patent application Ser. No. 10/956,714, filed Oct. 1, 2004, the relevant portions of each of which are incorporated herein by reference. Semiconductor precursor inks comprising doped polysilanes may be described in U.S. patent application Ser. No. 11/867,587, filed Oct. 4, 2007; the relevant portions of each of which are incorporated herein by reference. Semiconductor precursor inks comprising undoped and/or doped semiconductor nanoparticles may be described in U.S. patent application Ser. No. 10/616,147, filed Jul. 8, 2003 the relevant portions of which are incorporated herein by reference. Alternatively, the semiconductor body 302 can be formed by one or more conventional thin-film processes or techniques.

A gate dielectric 304 may also be formed via a printing process (e.g., printing and/or deposition of a dielectric layer, etc.; see, e.g., U.S. Prov. Pat. Appl. No. 61/118,419, filed Nov. 26, 2008; the relevant portions of which are incorporated herein by reference) or by a conventional method (e.g., via deposition of an oxide or oxidation of a surface of a semiconductor film to form an oxide film, then patterning of the oxide film, etc.). Gate electrode 305 may similarly be formed by a printing process or by a conventional method, and may be formed from a metal or a semiconducting material. Source and drain regions 303 may also be formed by any number of methods (e.g., printing or depositing a dopant layer on semiconductor body 302, followed by a drive-in step; ion implantation, etc.; see, e.g., U.S. patent application Ser. No. 11/888,942, filed Aug. 3, 2007, and U.S. patent application Ser. No. 11/888,949, filed Aug. 3, 2007; the relevant portions of each of which are incorporated herein by reference). Furthermore, metal lines or interconnects connecting one or more additional devices and/or circuit elements to TFT 300 may also be formed via printing processes (see, e.g., U.S. patent application Ser. No. 12/175,450, filed Jul. 17, 2008 and U.S. patent application Ser. No. 12/131,002, filed May 30, 2008; the relevant portions of each of which are incorporated herein by reference), or by conventional thin-film or blanket deposition/photolithography processes.

Representative TFT 300 has been shown with regular, well defined features and regular dimensions. However, each of the fabricating steps in a method for making TFT 300 may have some variability associated therewith. Methods for making TFT 300 (or similar printed devices and/or circuit elements which may exhibit similar variability) may include printing one or more elements of TFT 300 (see, e.g., U.S. patent application Ser. No. 11/452,108, filed Jun. 12, 2006, U.S. patent application Ser. No. 11/888,942, filed Aug. 3, 2007, U.S. patent application Ser. No. 11/888,949, filed Aug. 3, 2007, U.S. patent application Ser. No. 11/818,078, filed Jun. 12, 2007, U.S. patent application Ser. No. 11/203,563, filed Aug. 11, 2005, and U.S. patent application Ser. No. 12/243,880, filed Oct. 1, 2008; the relevant portions of each of which are incorporated herein by reference). Accordingly, the shape of each of the features of TFT 300 may vary among manufacturing runs and/or from device to device.

For example, semiconductor body 302 may have a height H that varies within a known range H±x, where H is a target value for the height of semiconductor body 302 and x corresponds to the variability associated with the process for manufacturing TFT 300. Thus, in a production run of TFT 300, semiconductor body 302 may have a height ranging from (H−x) to (H+x). Similarly, the channel region in TFT 300 may have a length L that varies within a known range L±y, where L is a target value for the length of semiconductor body 302 and y corresponds to the variability associated with the process for manufacturing TFT 300. Thus, a channel region of TFT 300 may have a length ranging from (L−y) to (L+y). Further, a channel region of TFT 300 may have a width W that may varies within a known range W±z, where W is a target value for the width of semiconductor body 302 and z corresponds to the variability associated with the process for manufacturing TFT 300. Thus, the width of a channel region of TFT 300 may range from (W−z) to (W+z). Thus, in a production run of TFT 300, the dimensions of the channel region from device to device may vary, for example, within the ranges of H±x, L±y and W±z as described above. Furthermore, while TFT 300 is shown with elements having rectilinear shapes and/or dimensions, the features of TFT 300 may have irregular shapes. For example, semiconductor body 302 and/or other features of TFT 300 may have a dome-shaped profile (see, e.g., U.S. patent application Ser. No. 12/243,880, filed Oct. 1, 2008; the relevant portions which are incorporated herein by reference), and the dimensions of such features may vary across the shape/and or profile of the features within ranges as described in reference to the exemplary rectilinear structure of semiconductor body 302.

Similarly, the formation of every other feature of TFT 300 (e.g., source/drain regions 303, gate dielectric 304, and gate electrode 305) will have a number of process and/or material variables associated therewith (e.g., size, shape, thickness, composition, etc.) that may vary within within a range associated with the process for manufacturing the features of TFT 300. For example, in the case of printed films or features, an ink may exhibit variations in the concentration of ink components over the course of a print run, and printed films or features may accordingly have (slightly) different chemical compositions. In addition, in any process step, undesired contaminants may be introduced, possibly resulting in additional variations between devices. Furthermore, each process variable associated with a particular printing or deposition method may affect the morphology of an individual feature, and consequently may increase (within determinable tolerances) the variation between printed features.

A printed or deposited amorphous semiconductor film or feature may be subsequently crystallized to form a polycrystalline semiconductor film, to improve the electrical characteristics of the semiconductor material. However, the process for crystallizing an amorphous semiconductor film or feature (e.g., a thermal process, laser process, etc.) may produce crystalline regions having somewhat variable crystal structures, orientations and/or crystallinity percentages and/or proportions, and the regions themselves may vary within known tolerances in size and shape. These variations in polycrystalline films or features formed from a printed semiconductor precursor ink may also contribute to variations between devices incorporating such polycrystalline films or features. Furthermore, typical substrates for use in TFTs include low cost glass, metal foil and/or polymer substrates, which have properties that vary (e.g., surface uniformity) more than those of a single crystal substrate. Variations in the surface characteristics of the substrate at different locations on the substrate (e.g., roughness, wettability, surface energy, etc.) may introduce additional variations between devices.

Consequently, there is typically some variation in the structure and/or performance of TFTs from device to device. Typical features of a TFT that may vary include film or feature composition (e.g., chemical composition, impurities); length, width and two-dimensional shape; film thickness; surface characteristics of a film or feature; crystalline region size, orientation and distribution in a channel film; etc. The total variation in the printed TFTs across a manufacturing lot of the devices is typically a combination of minor variations associated with the printing process and/or materials used for constructing the printed TFTs, and may vary over a statistically predictable or predetermined range.

Structural variations in a TFT result in concomitant variations in the electrical characteristics of a TFT. For example, electrical characteristics such as leakage current, on-current, or the threshold voltage of the TFT may vary as a result of variations in the structure and/or composition of a TFT. As previously described with respect to TFT 300, a channel region of TFT 300 may have a length, width and height that vary within the tolerances of a manufacturing process. Accordingly, the electrical characteristics of TFT 300, such as channel resistance, will vary as a function of the channel dimensions, composition, etc. Accordingly, the electrical characteristics of a TFT may vary between TFTs produced by a given manufacturing process within the tolerances of such a manufacturing process.

Due to the above-described device-to-device variations typically associated with TFTs, they are typically used in devices, circuits and/or applications that are either tolerant to such random variations in the electrical characteristics of the TFT, or include additional elements, arrangements, connectivity, etc. that may compensate for such variations. However, the nature of the variations in TFT manufacture may fortuitously provide a novel mechanism for introducing a random delay into a system, where such a system may employ a random delay element.

The present invention advantageously employs random variations in the electrical characteristics of TFTs associated with a manufacturing process as described above to provide a simple, low-cost means of implementing a random delay in circuits and/or systems such as RFID systems where random delays in the transmission of multiple identification messages from multiple RFID tags may prevent collisions between such messages.

The invention, in its various aspects, will be explained in greater detail below with regard to exemplary embodiments.

An Exemplary Circuit Configured to Generate a Delay

In a first aspect, the present invention relates to a circuit configured to generate a delay, including a delay element having an input terminal and an output terminal, a capacitor having a first terminal receiving an input and a second terminal coupled to the input of the delay element, and a thin-film field-effect transistor (TFT) having a first and second source/drain terminals and a gate, configured to provide a current and/or voltage to said capacitor, where the current and/or voltage has a value that falls randomly within a predetermined range.

The TFT may comprise one or more semiconductor layers (e.g., a transistor channel layer, a source/drain terminal layer, and/or one or more intrinsic and/or lightly- or heavily-doped diode layers); a gate insulator layer on or over at least one of the semiconductor layers; a gate metal layer on the gate insulator layer; a plurality of metal conductors in electrical communication with the gate metal layer and the source and drain terminals; and one or more dielectric layers between various metal conductors and/or semiconductor layer(s). Exemplary semiconductor, dielectric and metal layers of a TFT as described herein, and materials and methods for forming such a TFT are described in greater detail in U.S. Pat. No. 7,619,248 and U.S. patent application Ser. Nos. 11/203,563, 11/243,460, 11/452,108, 11/888,949, 11/888,942, 11/818,078, 11/842,884, 12/175,450, 12/114,741, 12/131,002 and 12/243,880, respectively filed on Aug. 11, 2005, Oct. 3, 2005, Jun. 12, 2006, Aug. 3, 2007, Aug. 3, 2007, Jun. 12, 2007, Aug. 21, 2007, Jul. 17, 2008, May 2, 2008, May 30, 2008, Oct. 1, 2008, the relevant portions of each of which are incorporated herein by reference.

In some embodiments, the TFT may be a printed TFT. Forming the printed TFT generally includes printing at least one layer comprising a semiconducting material in a first pattern on a substrate. Printing the layer(s) of the TFT may comprise printing an ink that includes one or more semiconductor (e.g., silicon) precursor(s), metal precursors, or dielectric precursors in a solvent in which the semiconductor, metal, or dielectric precursor(s) are soluble. For example, the semiconductor precursor may comprise silicon nanoparticles and/or an oligo- and/or polysilane, which may be doped or undoped. For further details, see U.S. Pat. Nos. 7,314,513 and 7,485,691 and U.S. patent application Ser. No. 11/867,587 filed on Oct. 4, 2007, the relevant portions of each of which are incorporated herein by reference.

In various embodiments, forming the TFT on a substrate further comprises printing a second layer of a second material in a second pattern on or above the first pattern. The second material may comprise a dielectric precursor, such as a molecular, organometallic, polymeric and/or nanoparticle precursor in a solvent or solvent mixture in which the dielectric precursor is soluble. In some embodiments, the dielectric precursor is a source of silica, silicon nitride, silicon oxynitride, aluminate, titanate, titanosilicate, zirconia, hathia, or ceria. Preferably, the solvent or solvent mixture for such embodiments comprises a high volatility solvent in an amount of at least 10 wt % relative to a second solvent or solvent mixture, and a low volatility solvent in an amount of at least 10 wt % relative to a second solvent or solvent mixture. In other embodiments, the dielectric precursor is an organic polymer or precursor thereof (e.g., an acrylic polymer), and the solvent or solvent mixture comprises a relatively high-viscosity, low volatility solvent or solvent mixture. The second material may further comprise a dopant precursor containing a dopant element selected from the group consisting of boron, phosphorous, arsenic, and antimony.

In a further embodiment, forming the TFT on the substrate further comprises printing a third layer of a third material in a third pattern on or above the first and/or second pattern(s). The third material may comprise a metal precursor, in which the metal precursor comprises one or more Group 4, 5, 6, 7, 8, 9, 10, 11, or 12 metal salts, complexes, clusters and/or nanoparticles in a third solvent or solvent mixture adapted to facilitate coating and/or printing of the metal precursor. In certain embodiments, the metal precursor comprises a metal salt, compound and/or complex having one or more ligands bound thereto that form gaseous or volatile byproducts upon reduction of the metal salt, compound and/or complex to an elemental metal and/or alloy thereof. The third material may further comprise one or more additives (e.g., one or more reducing agents) that can also form gaseous or volatile byproducts upon reduction of the metal salt, compound and/or complex to an elemental metal and/or alloy. Such metal formulations enable the printing of a pure metal film using metal precursor(s) and reducing agent(s) that generally do not leave substantially adverse levels of impurities and/or residues in the film. For additional details, see U.S. patent application Ser. No. 12/131,002, filed May 30, 2008, the relevant portions of which are incorporated herein by reference.

For each printed layer of the TFT, the printed precursor ink(s) is generally dried and cured. The lengths of time and the temperatures at which the ink is dried and the dried precursor(s) are cured depend upon the particular ink formulation and the particular precursor(s), but in general, the ink is dried at a temperature and for a length of time sufficient to remove substantially all of the solvent from the printed ink, and the dried precursor(s) are cured at a temperature and for a length of time sufficient to convert the precursor(s) to the material of the final film (e.g., a semiconductor, dielectric or metal). Additional description of exemplary printed TFTs and methods of making such printed TFTs are described in U.S. patent application Ser. No. 11/805,620, filed May 23, 2007 and U.S. patent application Ser. No. 12/243,880, filed Oct. 1, 2008, the relevant portions of each of which are incorporated herein by reference.

The present TFT may be formed by employing an "all printed" process, by a process employing a mixture of printing and conventional processing steps, or by conventional processing methods. The TFT may be an NMOS transistor or a PMOS transistor, and may be electrically connected and/or configured to function as, e.g., a transistor, a diode, a resistor, a capacitor, an off-connected TFT and/or any other possible configuration of the TFT compatible with the present circuit. In the present circuit, the TFT is configured to provide a current and/or voltage to one terminal of a capacitor. As described above, the TFT has electrical characteristics associated therewith such as a leakage current, on-current, or threshold voltage that will vary within the tolerances of the manufacturing process utilized in making the TFT. For example, the random value(s) of the electrical parameters such as a leakage current, on-current, or threshold voltage may be associated with variability in the dimensions, shape, topology and/or composition of the TFT features, layers and/or components (e.g., body, gate, source/drain regions, etc.).

In certain embodiments, the TFT may comprise a material that provides a predetermined range of leakage current, on-current, or threshold voltage values. Such a material may be employed in forming a channel region, source/drain region(s), or a gate electrode. For example, the TFT may comprise one or more semiconductor layer(s) that function as a channel region, source/drain region(s), or a gate electrode. In some embodiments, the same material may be used to form a channel region and source/drain region(s). The size and/or shape of the semiconductor layer that functions as the channel region, source/drain region(s), or a gate electrode of the TFT may vary within certain known limits (e.g., within the variability range associated with the method for depositing the channel material as described herein). Thus, the characteristics of the material that comprises the channel region, source/drain region(s), or gate electrode, such as the composition, length, width, thickness, topography, crystalline structure, or other characteristics, will affect the value of the electrical characteristics of the TFT such as leakage current, on-current, or threshold voltage. For example, a longer channel in a TFT generally results in a higher resistance associated with current flow from source to drain, thus affecting the value of the on-current and threshold voltage of the TFT comprising such a longer channel relative to a TFT having a shorter channel.

In some embodiments, the material that provides the predetermined range of a leakage current, an on-current, or threshold voltage of the TFT may be amorphous silicon or polysilicon, which may be doped with a dopant, such as an n-type dopant or a p-type dopant (e.g., B, P, As, Sb, etc.). In certain embodiments, the amorphous or polycrystalline silicon is doped with an amount of dopant sufficient to control a threshold voltage of a TFT containing such doped amorphous or polycrystalline silicon. For example, the amorphous or polycrystalline silicon may have a dopant concentration of from about $10^{16}$ to about $5\times10^{18}$ atoms/cm$^3$. In addition, the doped amorphous or polysilicon material forming a channel region of a TFT may have a geometry (e.g., length, width, or thickness as described above) that determines the predetermined range of current or voltage that the TFT may provide to downstream circuit elements. Accordingly, the manufacturing parameters that determine the geometry of the features of the TFT of the present circuit may be varied to obtain a desired target range of electrical parameters associated with the TFT. For example, a shorter channel and/or a lower dopant concentration in a channel region of a TFT may lower the threshold voltage of the TFT. Conversely, a longer channel region may afford a higher threshold voltage.

The present circuit configured to generate a delay further includes a capacitor having a first terminal receiving an input, and a second terminal coupled to an input of a delay element and a source/drain terminal of the TFT, so as to receive a current and/or voltage from the TFT. Generally, capacitor comprises a first undoped or doped semiconducting layer and a second undoped or doped semiconducting layer, with a dielectric layer therebetween electrically isolating the two semiconducting layers. In some embodiments, however, the electrically active layers of the capacitor may comprise one or more metals and/or alloys. The capacitor may also include contacts in electrical communication with the first and second undoped or doped semiconducting layers, configured to electrically connect the capacitor to one or more of a TFT, a delay element and/or other circuit elements. The contacts generally comprise a metal, and may be formed by one of the printing techniques described above. Thus, for example, printing the contacts generally comprises printing a first metal precursor ink in a pattern, optionally forming a first undoped or doped semiconducting layer, forming the intervening capacitor dielectric layer, optionally forming a second undoped or doped semiconducting layer, and then printing a second metal precursor ink in a pattern on the second semiconducting layer, or plating a second metal on a patterned on a patterned semiconductor and/or metal layer.

The present capacitor may be produced according to manufacturing processes used to make the TFT, thus enabling construction of both the TFT and the capacitor in at least some concurrent steps. For example, the capacitor may be made by depositing layers of undoped or doped semiconducting material, dielectric material and/or metal on a substrate. In some embodiments, the capacitor may be formed by employing an "all printed" process, by a process employing a mixture of printing and conventional processing steps, or by conventional processing methods. Exemplary capacitors and methods for making such capacitors are described in U.S. patent application Ser. No. 11/452,108, filed Jun. 12, 2006, U.S. patent application Ser. No. 12/249,841, filed Oct. 10, 2008 and U.S. patent application Ser. No. 12/243,880, filed Oct. 1, 2008, the relevant potions of each of which are incorporated herein by reference. The capacitor may have a capacitance value selected in conjunction with a resistance value of the TFT to provide a desired RC time constant $\tau$ (e.g., associated with a resistance R of the TFT and a capacitance C of the capacitor), as will be described in detail below in reference to the exemplary circuit 400 of FIG. 4.

The present circuit further comprises a delay element having an input terminal and an output terminal, configured to receive an input signal and provide an output signal. The delay element input terminal may be electrically connected to a source/drain terminal of the TFT, and one terminal of the capacitor of the present circuit. The delay element generally receives an input signal, and delays the signal for a predetermined period of time before providing an output signal. However, the delay element may also function in concert with the present TFT and capacitor to effect the delay of a signal. The delay element of the present circuit may comprise one or more logic gates configured to delay an input signal for a predetermined period of time. The logic gate(s) may be selected and/or configured to provide a desired delay and/or output in response to an input. In some embodiments, the delay element comprises a plurality of inverting logic gates having an input coupled to (i) the capacitor of the present circuit and (ii) an output of the TFT. Alternatively, the delay element may comprise or consist essentially of an inverter. Delay elements comprising logic gates as described herein may be designed and implemented according to procedures well known to those skilled in the art.

For example, the delay element may comprise one or more logic gates (e.g., inverters, etc.), which may be constructed using Complementary Metal Oxide Semicondonductor (CMOS) logic. Thus, the logic gate(s) in the present delay element may comprise one or more TFTs. Accordingly, TFTs in such logic gates may be produced according to manufacturing processes used to make the TFT providing a current and/or voltage to the capacitor, advantageously enabling construction of the TFT, the capacitor, and the delay element in at least some concurrent steps. For example, TFTs in a delay element of the present circuit may be made by depositing layers of semiconducting material (which may or may not contain a dopant), dielectric material and/or metal on a substrate as described above. Accordingly, the elements of the present circuit for generating a delay may be formed simultaneously by employing an "all printed" process or by a process employing a mixture of printing and conventional processing steps to form the present circuit.

Figure 4:
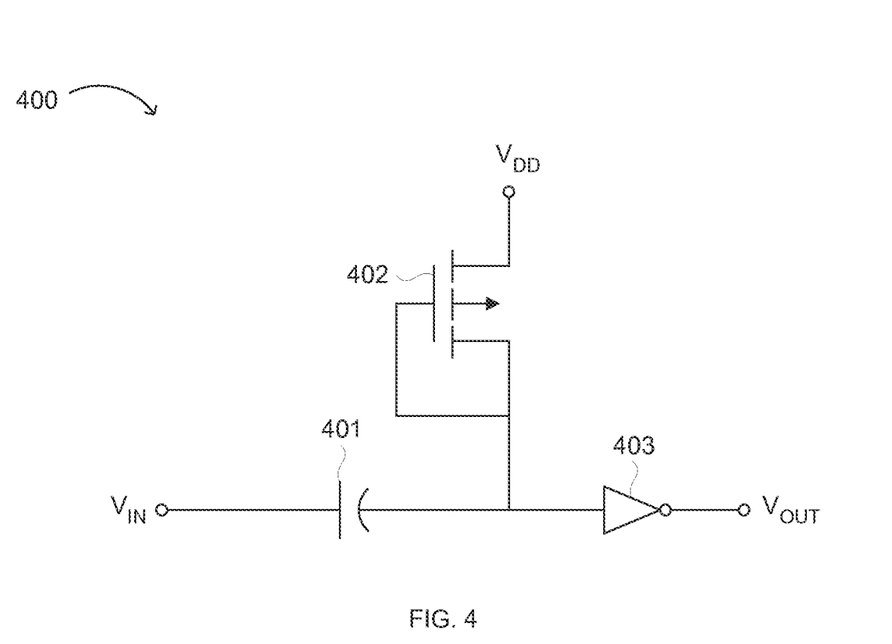
FIG. 4 is a schematic diagram of an exemplary circuit for generating a random delay.

FIG. 4 shows an exemplary embodiment of a circuit configured to generate a delay, comprising an NMOS off-connected TFT 402, a capacitor 401, and an inverter 403. TFT 402 has a first source/drain terminal having an input signal $V_{DD}$. $V_{DD}$ is generally a DC supply voltage, and may be essentially any value compatible with delay circuit 400, typically on the order of 5 V or less, or any other voltage or range of voltages compatible with digital logic circuits and/or circuit elements. In exemplary circuit 400, TFT 402 is shown with a second source/drain terminal electrically connected to the gate electrode of TFT 402 in an off-connected configuration. The second source/drain terminal of TFT 402 is electrically connected to a second terminal of capacitor 401 and an input of inverter 403. Capacitor 401 receives an input $V_{IN}$ on a first terminal, and has a second terminal connected to an input of inverter 403. Inverter 403 is configured to receive a voltage $V_X$ at an input terminal, and provide an output $V_{OUT}$. Additional inverters may be linked in series with inverter 403, as desired. In some embodiments, $V_{OUT}$ may be a timing signal (e.g., the delay signal) provided to a downstream circuit and/or circuit element (see, e.g., the discussion of FIG. 5 below).

The function(s) of exemplary delay circuit 400 will now be explained with reference to FIG. 4. At a time prior to inputting a signal $V_{IN}$, delay circuit 400 is powered up, $V_{IN}$ is high, both plates of capacitor 401 are at a voltage $V_{DD}$ (e.g., the DC source voltage for circuit 400), and output $V_{OUT}$ is low. At a time T=0, an input signal (e.g., $V_{IN}\rightarrow 0$) for a short duration (e.g., less than a period of time $\tau$) is provided to the first terminal of capacitor 401. Capacitor 401 is pulled low since it is discharged, and $V_{OUT}$ switches to a high state (e.g., $V_{DD}$). Capacitor 401 then charges via a leakage current through TFT 402. The flow of current through TFT 402 charges capacitor 401, and at a time T=$\tau$ (e.g., the RC time constant $\tau$ of the circuit) when capacitor 401 is charged, inverter 403 changes the output state and $V_{OUT}\rightarrow 0$. Thus, the leading edge of input signal $V_{IN}$ is delayed by a duration $\tau$ at the output $V_{OUT}$. The duration of time t varies from device to device in accordance with random variations in the capacitance of capacitor 401 and the resistance of TFT 402, since $\tau$ is a direct function of both parameters.

As described above, TFT 402 provides a current in circuit 400 that is a direct function of the overall resistance of TFT 402. Furthermore, the electrical characteristics of TFT 401, including the overall resistance of TFT 402, may vary randomly within the tolerances associated with a manufacturing process by which TFT 402 is produced. Thus, since time T is a direct function of the on-current (via the resistance) of TFT 402, the duration of the delay time T will have a random value that is a function of the tolerances associated with a manufacturing process by which TFT 402 is produced. For example, since TFT 402 can be configured in an off-connected mode, the gate can always be at a voltage lower than the threshold voltage of the TFT. In an alternative, the gate of TFT 402 can be connected to ground potential (e.g., V=0). Thus, current through TFT 402 may be a leakage current only, which may vary by as much as several orders of magnitude due to variations between TFTs, and accordingly, T can vary greatly from device to device.

An Exemplary Monostable Oscillator

In another aspect, the present invention concerns a monostable oscillator including a capacitor, a resistive element providing a current and/or voltage to a first electrode of the capacitor, and a feedback path, where the current and/or voltage has a value that falls randomly within a predetermined range.

In some embodiments of the present monostable oscillator, the resistive element comprises a TFT. The TFT may be as described above, and may comprise, for example, an NMOS TFT or a PMOS TFT. The TFT may be electrically connected and/or configured to function as, e.g., a transistor, a diode, a resistor, a capacitor, an off-connected TFT and/or any other possible configuration of the TFT that provides a resistive element. In certain embodiments, the resistive element is an off-connected TFT (e.g., with the gate and a source/drain terminal electrically connected and held to a voltage that keeps the TFT off). The resistive element is not limited to a TFT, and may be a resistor, a diode, or any other circuit element or combination of elements that provides a variable resistance to the flow of current from device to device.

In the present monostable oscillator, the resistive element is configured to provide a current and/or voltage at one terminal of a capacitor. Generally, the predetermined range within which the current and/or voltage supplied by a TFT resistive element of the present monostable oscillator depends upon the operating range of the TFT. As described above, a TFT resistive element has electrical characteristics associated therewith such as a leakage current, on-current, and/or threshold voltage that vary within the tolerances of the manufacturing process utilized in making the TFT. Thus, the randomness of the current and/or voltage provided by a TFT resistive element will vary as a function of the variations associated with the manufacturing process for making the TFT. In some embodiments, a TFT resistive element comprises a material that provides a predetermined range of leakage current, on-current, and/or threshold voltage, as previously described herein. The present monostable oscillator further includes a capacitor as previously described above, and may be produced according to the manufacturing processes described elsewhere herein.

The present monostable oscillator further comprises a feedback path, which may comprise a printed semiconducting material or metal (see, e.g., U.S. patent application Ser. No. 12/175,450, filed Jul. 17, 2008 and U.S. patent application Ser. No. 12/131,002, filed May 30, 2008; the relevant portions of each of which are incorporated herein by reference). The feedback path may electrically connect a terminal of the resistive element, a first terminal of the capacitor, and a second terminal of the capacitor. There may be additional circuit elements (e.g., logic gates) interposed in the feedback path. Thus, in certain embodiments, the feedback path comprises one or more logic gates. The logic gate(s) may be configured to provide a desired delay and/or output in response to an input. In some embodiments, the logic gate(s) include inverter logic having an input coupled to a terminal of the resistive element and a terminal of the capacitor, and having an output comprising a timing signal (e.g., the delay signal). Logic gates as described herein may be designed and implemented according to procedures well known to those skilled in the art.

Figure 5:
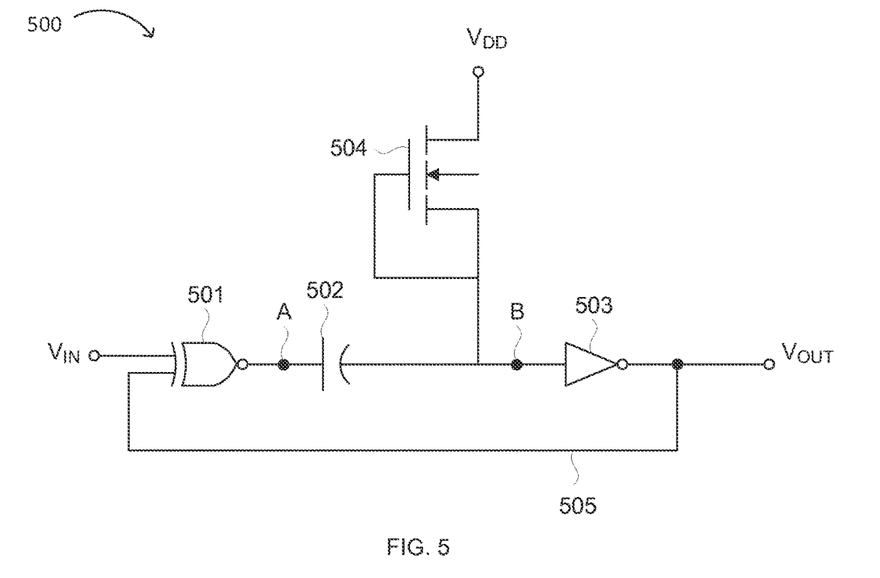
FIG. 5 is a schematic diagram of an exemplary monostable oscillator.

FIG. 5 shows an exemplary monostable oscillator 500, comprising a TFT resistive element 504, a capacitor 502, an inverter 503, a feedback path 505, and a XNOR gate 501. TFT 504 has a first source/drain terminal having an input signal $V_{DD}$. $V_{DD}$ is generally a DC supply voltage, and may be essentially any value compatible with monostable oscillator 500, typically on the order of 5 V or less, or any other voltage or range of voltages compatible with digital logic circuits and/or thin-film circuit elements. In exemplary monostable oscillator 500, TFT 504 is an NMOS TFT with a source/drain terminal electrically connected to the gate electrode of TFT 504 in an off-connected configuration. A second source/drain terminal of TFT 504 is electrically connected to a second terminal of capacitor 502 and an input inverter 503. Capacitor 502 receives an input $V_A$ at node A from XNOR gate 501, and has a second electrode connected to an input of inverter 503 at node B. Inverter 503 is configured to receive a voltage $V_B$ at an input terminal, and provides an output $V_{OUT}$. Additional inverters may be linked in series with inverter 503, as desired. In some embodiments, $V_{OUT}$ may be a timing signal (e.g., the delay signal) provided to a downstream circuit and/or circuit element (e.g., a counter that controls the ooutput of identification and/or other data from the device/tag) and fed back to XNOR gate 501 along feedback path 505. XNOR gate 501 is configured to receive two inputs, $V_{IN}$ (e.g., a trigger or initiation pulse), and $V_{OUT}$ from feedback path 505.

The function(s) of exemplary delay circuit 500 will now be explained with reference to FIG. 5. At a time prior to inputting a signal $V_{IN}$, monostable oscillator 500 is powered up, providing a voltage $V_{DD}$ (e.g., the DC source voltage for circuit 500) to TFT 504. Trigger signal $V_{IN}$ is low, both plates of capacitor 502 (and nodes A and B) are at $V_{DD}$, and output $V_{OUT}$ is low. At time T=0, an input signal (e.g. $V_{IN} \rightarrow V_{DD}$) is provided to XNOR gate 501 for a short duration (e.g., less than a period of time τ), pulling down the voltage on capacitor 502 (e.g., $V_A \rightarrow 0$ and $V_B \rightarrow 0$), and switching the output of inverter 503 to a high state (e.g., $V_{OUT} \rightarrow V_{DD}$). Capacitor 501 then charges via a leakage current through TFT 504. The flow of current through TFT 504 charges capacitor 502, and at a time T=τ (e.g., the RC time constant τ of the circuit) when capacitor 502 is charged (e.g., $V_A = V_{DD}$ and $V_B = V_{DD}$), inverter 503 changes the output state and $V_{OUT} \rightarrow 0$. Thus, the leading edge of input signal $V_{IN}$ is delayed by a duration τ at the output $V_{OUT}$. The duration of time τ can be varied in accordance with random variations in the capacitance of capacitor 502 and the resistance of TFT 504, since τ is a direct function of both parameters. The present monostable oscillator is retriggerable, and the cycle can be triggered again by repeating input $V_{IN}$ at a desired frequency. The duration of trigger signal $V_{IN}$ is not particularly limited, and may be any duration less than τ.

In addition, other logic can be used that is functionally equivalent to XNOR gate 501, alone or in combination with inverter 503. Also, inverter 503 may comprise a plurality of serially-connected inverters (e.g., 2n inverters or 2n+1 inverters) depending on the logic gate(s) receiving $V_{IN}$ and $V_{OUT}$ from feedback path 505. Thus, a desired input and/or output may be effected by employing one or more logic gate(s) as described herein.

As described above, TFT 504 provides a current in exemplary monostable oscillator 500 that is a direct function of the overall resistance of TFT 501. Furthermore, the electrical characteristics of TFT 504, including the overall resistance of TFT 504 may vary randomly within the tolerances associated with a manufacturing process by which TFT 504 is produced. Thus, since time t is a direct function of the on-current (via the resistance) of TFT 504, the duration of the delay time t will have a random value that is a function of the tolerances associated with a manufacturing process by which TFT 501 is produced.

An Exemplary Circuit Configured to Broadcast a Repetitive Message

A further aspect of the invention relates to a circuit configured to broadcast a repetitive message in a wireless system including an antenna configured to receive a power transmission and broadcast a repetitive identification message, a power-up circuit providing an initiation signal, a monostable oscillator configured to provide a repeating timing signal, a memory element providing the identification message, and an output circuit configured to broadcast the identification message in response to the timing signal. In some embodiments, the circuit includes one or more shift register(s) and a clock generator configured to provide a clock signal to the one or more shift register(s). Exemplary circuits and methods for making such circuits are described in U.S. patent application Ser. No. 11/452,108, filed Jun. 12, 2006, U.S. patent application Ser. No. 11/544,366, filed Oct. 6, 2006, U.S. patent application Ser. No. 11/203,563, filed Aug. 11, 2005, and U.S. patent application Ser. No. 12/249,707, filed Oct. 10, 2008, the relevant portions of each of which are incorporated herein by reference.

Figure 6:
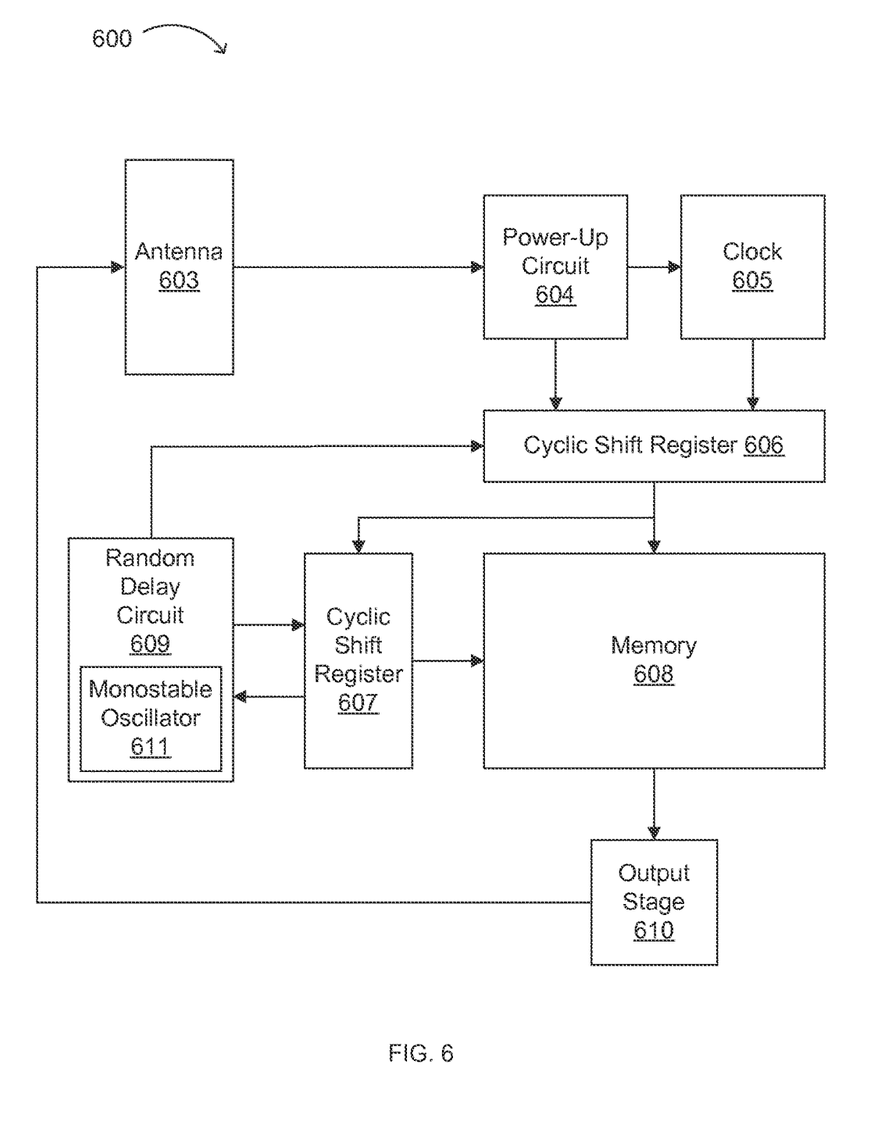
FIG. 6 is a block diagram of an exemplary wireless device for broadcasting a repetitive message.

In some embodiments, the present circuit is configured to broadcast a repetitive identification message in an RFID system. For example, FIG. 6 is a block diagram of an exemplary circuit 600 configured to broadcast a repetitive identification message in an RFID system, including antenna 603, power-up circuit 604, clock subcircuit 605, cyclic shift registers 606 and 607, memory portion 608, random delay circuit 609 including monostable oscillator 611 and output circuit 610. Antenna 603 may be implemented using a resonant LC circuit for use at 13.56 MHz, for example. Alternatively, the antenna may be implemented using a dipole or similar such antenna for 900 MHz or 2.4 GHz operation. However, the present circuit may employ antennas that operate in the LF, HF, VHF, and UHF regimes (e.g. 100-150 KHz, 5-15 MHz, 800-1000 MHz, and 2.4-2.5 GHz). Such devices are described in further detail in U.S. patent application Ser. Nos. 11/452,108 and 12/467,121 filed Jun. 12, 2006 and May 15, 2009, respectively, the relevant portions of each of which are incorporated herein by reference.

Generally, the antenna may be used to provide power for operation of the tag circuitry, and to provide information from the tag to a tag reader or interrogator (e.g., a repetitive identification message). Using power-up circuit 604, power can be extracted by rectifying an RF signal collected by antenna 603 and storing the resultant charge in a storage capacitor. Thus, when a tag enters a region of space with sufficient electromagnetic radiation being transmitted from a nearby reader, the storage capacitor begins to charge-up, and a voltage across the capacitor increases accordingly. When the voltage reaches a sufficient value, an "enable" signal can be generated, and this enable signal can be used to initiate the operation of circuit 600 (e.g., by powering up and initiating the respective functions of clock 605, cyclic shift registers 606 and 607, and random delay circuit 609 including monostable oscillator 611).

In an exemplary clocking subcircuit (e.g., 605), a clock signal can be generated so as to synchronously operate associated circuitry (e.g., cyclic shift registers 606 and 607). This clock signal may be generated by dividing down the incident RF signal received by antenna 603, by generating a local clock signal using an on-chip oscillator, or by demodulating a reader-provided clock signal from the received RF signal. This clock signal may be used to drive cyclic shift register 606, which may begin shifting a single predetermined state (e.g., a binary "high" bit) through all the rows addressing the memory, thus selecting one row of memory at a time. The output of cyclic shift register 606 may in turn be used to clock a second cyclic shift register 607, thus shifting a single high bit through all the columns addressing the memory, thus selecting a single column of memory at a time.

Random delay circuit 609 may comprise a monostable oscillator 611, which may include a capacitor, a resistive element providing a current and/or voltage to a first electrode of the capacitor, and a feedback path, where the current and/or voltage has a value that falls randomly within a predetermined range (e.g., such as the exemplary monostable oscillator of FIG. 5). As described above, a resistive element in monostable oscillator 611 provides a current that is a direct function of the overall resistance of the resistance element. The electrical characteristics of the resistance element may vary randomly within the tolerances associated with a manufacturing process by which the resistance element is produced is produced. Thus, since the duration τ of the delay of a signal through monostable oscillator 611 is a direct function of current [τ=f(RC) as previously described herein] through a delay element in monostable oscillator 611, the duration of the delay time τ will have a random value that is a function of the RC time constant of, e.g., a (printed) TFT delay element and a (printed) capacitor in monostable oscillator 611. The random element in the RC time constant generally is determined by the tolerances associated with a manufacturing process by the delay element in which monostable oscillator 611 is produced. Furthermore, monostable oscillator 611 can receive a repeating initiation signal and/or provide a repeating delayed output accordingly.

In operation, as cyclic shift registers 606 and 607 go through their sequence, various bits or portions of a predefined bit string can be transferred back to the reader. At the end of the sequence, the random delay circuit 609 can be triggered by the output of cyclic shift register 607 to cause circuit 600 to "go silent" and remain in this silent state for an interval determined by random delay circuit 609. As previously described, the delay period will have a duration that falls randomly within a predetermined range determined by monostable oscillator 611. The delay period may also be affected by, e.g., environmental or physical parameters such as temperature, power delivered to the tag, and/or electrical performance of various components within the delay circuit. When random delay circuit 609 completes its cycle, it can reset shift registers 606 and 607, and the overall process can be repeated.

Bits provided from memory 608 in circuit 600 may be passed to output stage 610, and transmitted via antenna 603 for information (e.g., in the form of a bit string) transfer back to a reader or interrogator. The information transfer can be accomplished by modulation of the tag impedance, for example. Alternatively, other common modulation schemes, such as amplitude shift keying and/or frequency shift keying may also be used.

An Exemplary Wireless System

The present invention further relates to a wireless system including at least two wireless devices, each wireless device comprising an antenna configured to receive a power transmission and broadcast a repetitive message, a power converting element coupled to the antenna, and a circuit configured to generate the repetitive message, where the circuit includes at least one thin film transistor (TFT) configured to introduce a random delay in the repetitive message. In some embodiments, the present system may be an RFID system, and the wireless devices may be RFID tags. In other embodiments, the repetitive message of the present system is an identification message.

An antenna on a wireless device (e.g., an RFID tag) may be implemented using a resonant LC circuit for use at 13.56 MHz, for example. Alternatively, the antenna may be implemented using a dipole or similar such antenna for 900 MHz or 2.4 GHz operation. However, present wireless systems and devices may employ antennas that operate in the RF, HF, VHF, and UHF regimes (e.g. 100-150 KHz, 5-15 MHz, 800-1000 MHz, and 2.4-2.5 GHz). Such devices are described in further detail in U.S. patent application Ser. Nos. 11/452,108 and 12/467,121 filed Jun. 12, 2006 and May 15, 2009, respectively, the relevant portions of each of which are incorporated herein by reference. Generally, the antenna may be used to provide power for operation of the tag circuitry and to provide information from the tag to a tag reader or interrogator (e.g., a repetitive identification message).

A power converting element on the wireless device may be configured to extract power from an RF transmission (e.g., from an RFID reader station) by rectifying an RF signal received by the antenna and storing the resultant charge in a storage capacitor. Thus, when a wireless device enters a region of space with sufficient electromagnetic radiation being transmitted from a nearby reader, the storage capacitor begins to charge-up, and a voltage across the capacitor increases accordingly. When the voltage reaches a sufficient value, an "enable" signal can be generated, and this enable signal can be used to initiate the operation of the wireless device circuit elements and/or circuit (e.g., by powering up and initiating the respective functions of the circuit elements on an RFID tag). RFID tags suitable for use in the present system are described in U.S. patent application Ser. No. 11/452,108, filed Jun. 12, 2006, U.S. patent application Ser. No. 11/544,366, filed Oct. 6, 2006, U.S. patent application Ser. No. 11/203,563, filed Aug. 11, 2005, and U.S. patent application Ser. No. 12/249,707, filed Oct. 10, 2008, the relevant portions of each of which are incorporated herein by reference.

The wireless device may include circuit elements and/or circuits as previously described herein configured to receive an initiation signal, and generate a repetitive message in response thereto. For example, the wireless device may include a circuit comprising at least one thin film transistor (TFT) configured to introduce a random delay in the broadcast of a repetitive message. In some embodiments, the circuit configured to generate the repetitive message includes a monostable oscillator configured to generate an oscillating signal having a period corresponding to a value of a characteristic electrical parameter of the TFT such as leakage current, on-current, and/or threshold voltage value, where the value of the characteristic electrical parameter falls randomly within a predetermined range as previously described herein.

Each wireless device may have a random delay in the broadcast of its respective message. Thus, when two (or more) wireless devices in the present wireless system are energized, each wireless device antenna receives a power transmission, powers up the wireless device via a power converting element coupled to the antenna, and broadcasts a repetitive message as preciously described herein. Since each wireless device will (almost certainly) have a slightly different delay in broadcasting the message back to the reader, collisions between messages from two (or more) energized wireless devices in a read field may be avoided. Accordingly, the present wireless system provides a mechanism for introducing random delay in the broadcast intervals of individual wireless devices (e.g., RFID tags) by utilizing random variations in a manufacturing process from producing such wireless devices.

An Exemplary Method of Forming a Collision Tolerant Wireless System

The present invention further relates to method of forming a collision tolerant wireless system, including determining a target variation range in the broadcast delay of a plurality of wireless devices having substantially the same architecture, the target range being configured to reduce a broadcast collision frequency between the wireless devices when the wireless devices broadcast repetitive messages in the same read field; determining a random variation range in the broadcast delay of the wireless devices, comparing the target variation range and the random variation range; and if the random variation range is at least equal to (e.g., within) the target variation range, making the wireless devices having the random variation range in their broadcast delay. In some embodiments of the present method, the wireless system is an RFID system, and the wireless devices are RFID tags. In other embodiments, the repetitive message of the present system is an identification message.

Generally, the target range is configured to reduce a broadcast collision frequency between the wireless devices when the wireless devices broadcast repetitive messages in the same read field. The target range for the delay in broadcast of repetitive messages is generally selected such that the minimum span of the target range is broad enough (e.g., $\tau \pm m$ %, where $\tau$ is the delay time of the circuit) to ensure that the system can accommodate the desired or anticipated number of devices which may be broadcasting simultaneously in a read field without collisions between broadcasts. The maximum span of the target range (e.g., $\tau \pm n$ %, where n>m) may be the maximum range of delay that is compatible with the operating range of the reader system (e.g., broadcasts occur at frequencies high enough to be occur at least once while passing through a read field). Thus, a suitable target range may vary somewhat and can be determined based on the particular parameters required for a given application (e.g., the number of devices that may be transmitting at any given time, and the maximum delay for operability of the system).

Determining a target variation range in the broadcast delay of a plurality of wireless devices having substantially the same architecture may include determining how broad a range of broadcast delays is necessary for a given or specific application. For example, the determination can be made with reference to the number of potential devices involved in simultaneous transmission, the frequency of transmission, the length of the broadcast message, and/or the timelines and/or robustness specification(s)/requirements of the transmission. However, it is to be appreciated that other considerations are contemplated in accordance with embodiments of the present invention.

Figure 7:
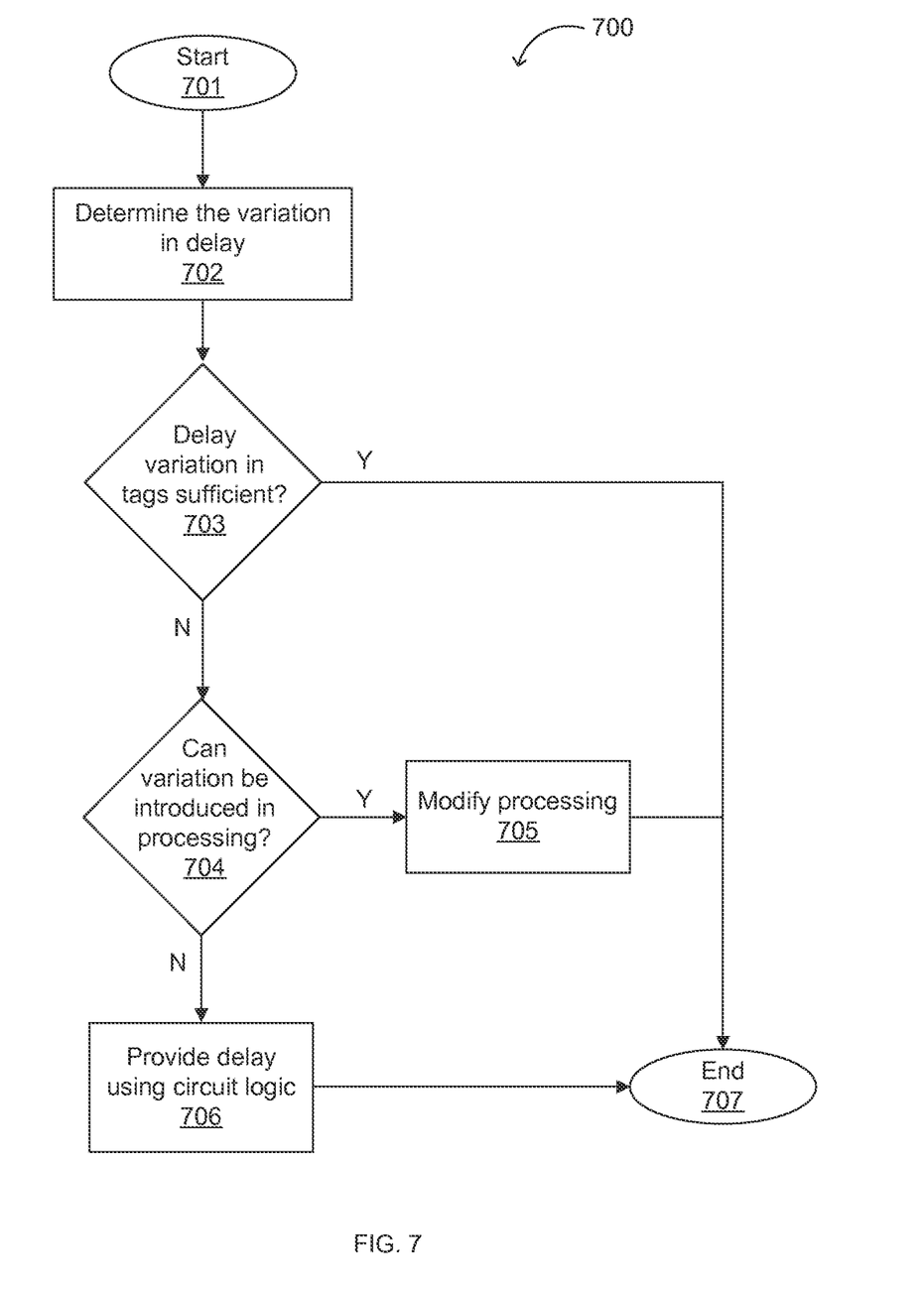
FIG. 7 is a flow chart embodying an exemplary method of forming a collision tolerant wireless system.

FIG. 7 is a flowchart of an exemplary method for forming a collision tolerant RFID system. At step 702, a random variation range in the broadcast delay of the RFID tags is determined. Defining the broadcast delay range may comprise determining whether a specific architecture, TFT structure, design and/or processing/fabrication method will provide a random transmission delay variation as described above. For example, determining the random variation range in the broadcast delay of a lot or production run of RFID tags may comprise testing a representative sample of the RFID tags, and measuring the transmission delay associated with each tag, thereby determining the range of delay times associated with the tags. Variability in the transmission delay of the RFID tags may be implemented in the present approach by exploiting the variations in the electrical characteristics such as leakage current, on-current and/or threshold voltage of individual TFTs as described herein. Such variability, as described above, is associated with the variability of a process or method for manufacturing components of RFID tags. In addition, variability in transmission delay can be specifically introduced, for example, by implementing individual delay circuit blocks with customizable variability, data driven delay logic, and other similar approaches and/or methods.

The target variation range and the measured random variation range of the manufactured tags may then be compared. At 703, if the random variation range is at least equal to the target variation range, then the method concludes with making the RFID tags having the measured random variation range in their broadcast delay. However, when the random variation range is less than the target variation range, then at 704, the present method may include determining whether the random variation range can be increased by modifying the manufacturing process by which the RFID tags are manufactured. In some embodiments, modifying the manufacturing process comprises changing one or more static design parameters, such as the dimensions and/or composition of one or more components (e.g., the length, width, thickness, topology, dopant and/or dopant level of a channel material in a TFT) of the RFID tag, or one or more manufacturing parameters (e.g., processing speed, heating and/or curing temperature and/or time, etc.), or a combination of manufacturing and static design parameters to effect a change in the random variability range of the broadcast delay of the RFID tags. For example, modifying the manufacturing process may include making minor changes in the channel lengths and/or widths of TFTs.

After changing one or more of the manufacturing and/or design parameters, the random variation range of tags produced by such a modified manufacturing process may be measured and compared to a target variation range. At 705, when the measured random variation range is increased by the modification to the manufacturing process, RFID tags may be made using the modified manufacturing process. However, if sufficient delay variation cannot be achieved via changes to the manufacturing process, at 706, a targeted delay may be implemented using additional circuit logic (e.g., comprising one or more logic gate(s) as described herein).

Thus, the present method for manufacturing a collision tolerant RFID system enables an integrated design and manufacturing process for wireless devices and systems. Such wireless devices and systems may simplify and streamline the production of wireless systems for specific applications (e.g., RFID applications) requiring specific technical specifications such as, for example, random variability in the broadcast delay of tags to be used in the RFID system. Furthermore, the present method may be applied to any system employing multiple wireless devices/tags where collision avoidance is desired and device priority is not important.

CONCLUSION/SUMMARY

Thus, the present invention provides circuits configured to generate a random delay in wireless communications systems, circuits configured to broadcast repetitive messages in wireless systems, wireless communication systems, collision tolerant wireless systems, and methods for forming such circuits, devices and/or systems. The present invention advantageously provides relatively low cost delay generating circuitry based on TFT technology in wireless electronics applications, particularly in RFID applications. Such novel, technically simplified, low cost TFT-based delay generating circuitry enables novel wireless communications circuits, systems, and method for producing such systems.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A monostable oscillator, comprising:
    a) a capacitor having a first terminal receiving an input and a second terminal coupled to an input of a delay element;
    b) a thin-film field-effect transistor (TFT) having a first source/drain terminal receiving a DC source or supply voltage, a second source/drain terminal coupled to said input of said delay element, and a gate electrically connected to said second source/drain terminal, said TFT being configured to provide a current and/or voltage to said second terminal of the capacitor; and
    c) a feedback path comprising the delay element, wherein the delay element comprises (i) an XOR gate or an XNOR gate and (ii) an output terminal, and the output terminal of the delay element is coupled to the first terminal of the capacitor;
    wherein said current and/or voltage has a value that falls randomly within a predetermined range.

2. The monostable oscillator of claim 1, wherein said predetermined range corresponds to an operating current and/or voltage range of said TFT.

3. The monostable oscillator of claim 2, wherein the randomness of said value is related to one or more variations in a manufacturing process of said TFT.

4. The monostable oscillator of claim 1, wherein said TFT comprises a printed TFT.

5. The monostable oscillator of claim 1, wherein said TFT comprises an NMOS TFT.

6. The monostable oscillator of claim 1, wherein said capacitor has a capacitance that, in conjunction with a resistance of the TFT, provides a desired RC time constant τ.

7. The monostable oscillator of claim 6, wherein said delay element further comprises one or more inverters, the XOR gate or XNOR gate is configured to (i) receive an output of said one or more inverters at a first terminal thereof and an input signal at a second terminal thereof, and (ii) provide an output coupled to the first terminal of the capacitor, and the RC time constant τ has a duration that varies in accordance with random variations in the capacitance of the capacitor and the resistance of the TFT.

8. The monostable oscillator of claim 6, wherein the RC time constant τ has a duration that varies in accordance with random variations in the capacitance of the capacitor and the resistance of the TFT.

9. The monostable oscillator of claim 1, wherein said delay element further comprises one or more inverters, and the XOR gate or XNOR gate is configured to receive an output of said one or more inverters at a first terminal thereof and an input signal at a second terminal thereof, and provide an output coupled to the first terminal of the capacitor.

10. A monostable oscillator, comprising:
    a) a capacitor having a first terminal receiving an input and a second terminal coupled to an input of a delay element;

b) a thin-film field-effect transistor (TFT) having a first source/drain terminal receiving a DC source or supply voltage, a second source/drain terminal coupled to said input of said delay element, and a gate electrically connected to said second source/drain terminal, said TFT being configured as a pull-up resistive element configured to provide a current and/or voltage to said second terminal of the capacitor; and c) a feedback path comprising the delay element, wherein the delay element comprises one or more inverters and an output terminal, and the output terminal of the delay element is coupled to the first terminal of the capacitor;

wherein said current and/or voltage has a value that falls randomly within a predetermined range.

11. The monostable oscillator of claim 10, wherein said predetermined range corresponds to an operating current and/or voltage range of said TFT.

12. The monostable oscillator of claim 11, wherein the randomness of said value is related to one or more variations in a manufacturing process of said TFT.

13. The monostable oscillator of claim 10, wherein said TFT comprises a printed TFT.

14. The monostable oscillator of claim 10, wherein said TFT comprises an NMOS TFT.

15. The monostable oscillator of claim 10, wherein said capacitor has a capacitance that, in conjunction with a resistance of the TFT, provides a desired RC time constant $\tau$.

16. The monostable oscillator of claim 15, wherein said delay element further comprises a logic gate configured to (i) receive an output of said one or more inverters at a first terminal thereof and an input signal at a second terminal thereof, and (ii) provide an output coupled to the first terminal of the capacitor, and the RC time constant $\tau$ has a duration that varies in accordance with random variations in the capacitance of the capacitor and the resistance of the TFT.

17. The monostable oscillator of claim 16, wherein said logic gate comprises an XNOR gate or an XOR gate.

18. The monostable oscillator of claim 10, wherein said delay element further comprises a logic gate configured to receive an output of said one or more inverters at a first terminal thereof and an input signal at a second terminal thereof, and provide an output coupled to the first terminal of the capacitor.

19. The monostable oscillator of claim 18, wherein the RC time constant $\tau$ has a duration that varies in accordance with random variations in the capacitance of the capacitor and the resistance of the TFT.

20. The monostable oscillator of claim 18, wherein said logic gate comprises an XNOR gate or an XOR gate.

* * * * *